(12) United States Patent
Zhang et al.

(10) Patent No.: US 10,488,265 B2
(45) Date of Patent: *Nov. 26, 2019

(54) CAMERA USING PHOTOSENSITIVE DEVICE

(71) Applicants: Tsinghua University, Beijing (CN); HON HAI PRECISION INDUSTRY CO., LTD., New Taipei (TW)

(72) Inventors: Ling Zhang, Beijing (CN); Yang Wu, Beijing (CN); Kai-Li Jiang, Beijing (CN); Chang-Hong Liu, Beijing (CN); Jia-Ping Wang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/234,437

(22) Filed: Dec. 27, 2018

(65) Prior Publication Data

US 2019/0137345 A1    May 9, 2019

Related U.S. Application Data

(63) Continuation of application No. 15/409,830, filed on Jan. 19, 2017, now Pat. No. 10,209,134.

(30) Foreign Application Priority Data

Jan. 22, 2016 (CN) .......................... 2016 1 0042560

(51) Int. Cl.
*G01J 4/00* (2006.01)
*G01J 9/00* (2006.01)
(Continued)

(52) U.S. Cl.
CPC ............... *G01J 9/00* (2013.01); *G01J 1/0429* (2013.01); *G01J 1/4228* (2013.01);
(Continued)

(58) Field of Classification Search
CPC .... G01J 9/00; G01J 1/0429; G01J 1/42; G01J 3/50; G01J 4/00; G01J 5/023; G01J 2003/507
(Continued)

(56) References Cited

U.S. PATENT DOCUMENTS

10,209,134 B2 * 2/2019 Zhang ........................ G01J 9/00
2006/0128087 A1 * 6/2006 Bamji ................... G01S 7/4816
438/199
(Continued)

*Primary Examiner* — Sunghee Y Gray
(74) *Attorney, Agent, or Firm* — ScienBiziP, P.C.

(57) ABSTRACT

An camera, the camera including: an photosensitive device and an image processor, wherein the photosensitive device includes a plurality of photosensitive units, a measuring device and a data processor; the plurality of photosensitive units are distributed in an array, wherein each photosensitive unit is configured to receive and convert light signal to form a temperature difference or a potential difference; the measuring device is configured to measure the temperature difference or the potential difference; a data processor is configured to analyze and calculate the potential difference or the temperature difference.

10 Claims, 6 Drawing Sheets

(51) Int. Cl.
- *G01J 1/04* (2006.01)
- *G01J 1/42* (2006.01)
- *H01L 27/30* (2006.01)
- *H01L 51/00* (2006.01)
- *H01L 51/44* (2006.01)
- G01J 5/02 (2006.01)
- G01J 3/50 (2006.01)

(52) U.S. Cl.
CPC ........ *H01L 27/307* (2013.01); *H01L 51/0048* (2013.01); *H01L 51/447* (2013.01); *G01J 5/023* (2013.01); *G01J 2003/507* (2013.01)

(58) Field of Classification Search
USPC .......................................................... 356/364
See application file for complete search history.

(56) References Cited

U.S. PATENT DOCUMENTS

| | | | | |
|---|---|---|---|---|
| 2009/0057536 A1* | 3/2009 | Hirose | ...................... | G01J 1/04 250/208.1 |
| 2011/0001843 A1* | 1/2011 | Koishi | ................ | H04N 1/6086 348/223.1 |

* cited by examiner

CAMERA USING PHOTOSENSITIVE DEVICE

CROSS-REFERENCE TO RELATED APPLICATIONS

This application is a continuation application of U.S. patent application Ser. No. 15/409,830, filed on Jan. 19, 2017, entitled, "PHOTOSENSITIVE DEVICE AND CAMERA USING THE SAME", which claims all benefits accruing under 35 U.S.C. § 119 from China Patent Application No. 201610042560.2, filed on Jan. 22, 2016, in the China National Intellectual Property Administration, the contents of which are hereby incorporated by reference. The disclosures of the above-identified applications are incorporated herein by reference.

FIELD

The subject matter herein generally relates to a photosensitive device.

BACKGROUND

Currently, photosensitive devices used in cameras are divided into two kinds: charge coupled device (CCD) and complementary metal oxide semiconductor (CMOS) device. The theories of photosensitive devices are that photosensitive device unit receiving light signal can convert light energy to electric charge or voltage to achieve the detection of light.

However, a combination of three light-sensing pixels in current CCD can obtain images by one exposure. As human eyes are most sensitive to green, green pixels on the CCD are the pixels resulting in lower image quality. Each pixel in CMOS devices is composed of four transistors and a photodiode. The structures of these pixels in CMOS devices are complex and having low sensitivity.

Providing an photosensitive device is needed for solving the problem discussed above.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views. Implementations of the present technology will now be described, by way of example only, with reference to the attached figures, wherein.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to better illustrate details and features. The description is not to be considered as limiting the scope of the embodiments described herein.

Several definitions that apply throughout this disclosure will now be presented.

The connection can be such that the objects are permanently connected or releasably connected. The term "substantially" is defined to be essentially conforming to the particular dimension, shape or other word that substantially modifies, such that the component need not be exact. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

Figure 1:
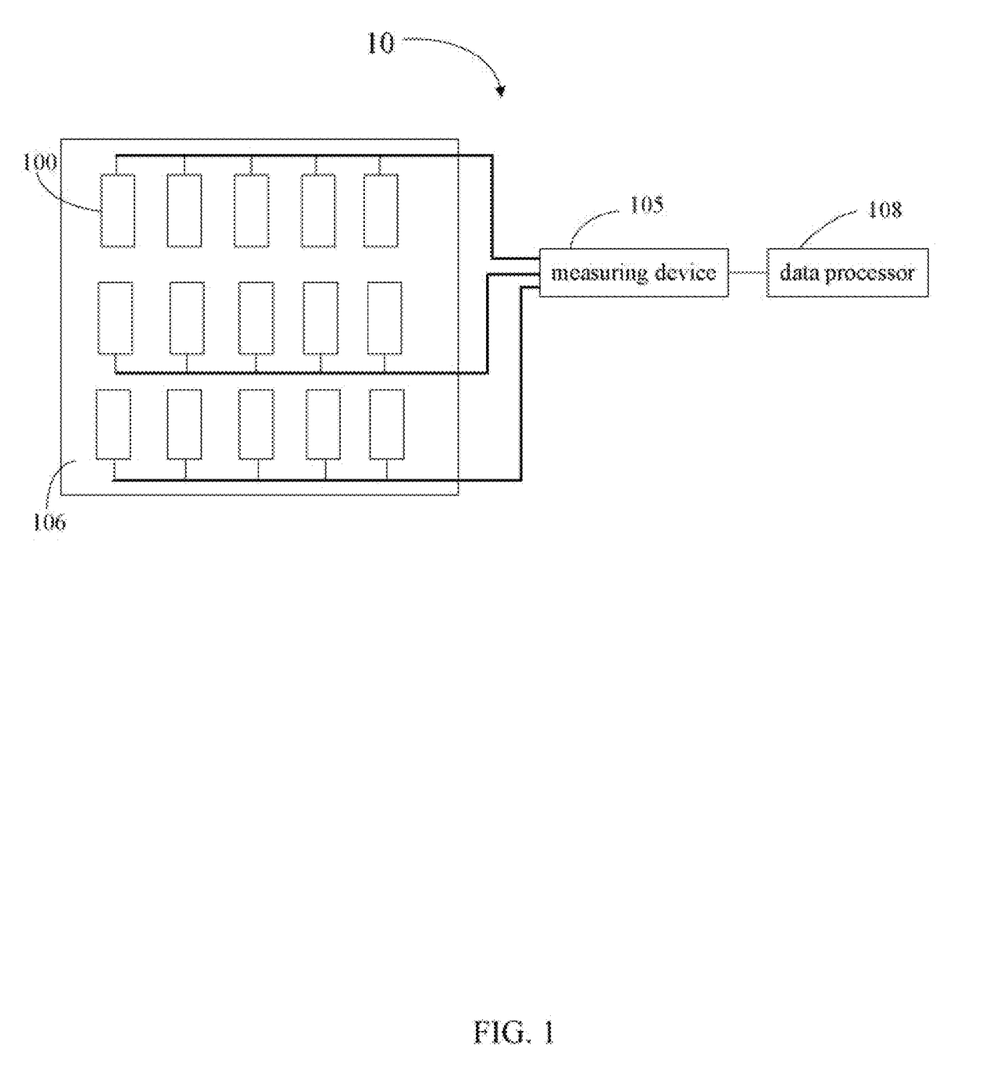
FIG. 1 is a schematic view of one embodiment of a photosensitive device.

FIG. 1 shows one embodiment of a photosensitive device 10 comprising a plurality of photosensitive units 100, a measuring device 105 and a data processor 108. The plurality of photosensitive units 100 are distributed in an array, and each photosensitive unit 100 can receive and convert light signals. Each photosensitive unit 100 is used to convert the light signals into temperature differences or potential differences. The measuring device 105 is used to measure the temperature differences or potential differences. The data processor 108 is used to obtain optical wavelengths by calculating and analyzing the temperature differences or the potential differences. Each photosensitive unit 100 is used as one pixel. The light signals in each pixel can be converted and calculated to obtain the wavelengths of the light signals by the measuring device 105 and the data processor 108. The light color in each pixel can be identified by the wavelength of the light. The photosensitive device 10 can be used to capture images. The spacing between the plurality of photosensitive units 100 and the size of the photosensitive unit 100 can be adjusted in accordance with the resolution of the image.

Figure 2:
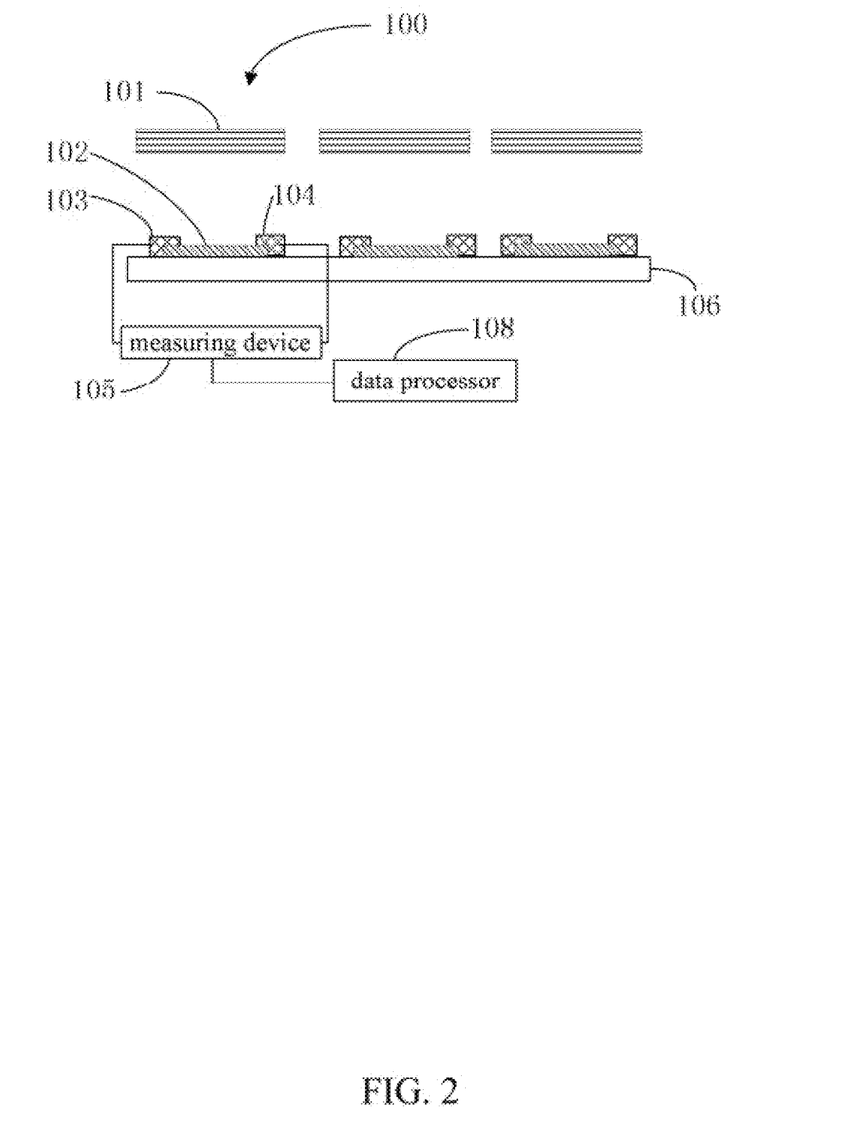
FIG. 2 is a schematic view of one embodiment of a photosensitive unit.

FIG. 2 shows the photosensitive unit 100 including a polarizer 101, a detecting element 102, a first electrode 103, a second electrode 104, a measuring device 105 and a data processor 108. The polarizer 101 is spaced from the detecting element 102 and used for generating polarized light. The first electrode 103 and the second electrode 104 are spaced apart from each other and electrically connected to the detecting element 102. The detecting element 102 is electrically connected to the measuring device 105 by the first electrode 103 and the second electrode 104. The detecting element 102 comprises a carbon nanotube structure. The carbon nanotube structure comprises a plurality of carbon nanotubes oriented along the same direction and is in direct contact with the first electrode 103 and the second electrode 104. The measuring device 105 is electrically connected to the first electrode 103 and the second electrode 104. The data processor 108 is connected to the measuring device 105.

The polarizer 101 and the detecting element 102 are parallel and spaced from each other. The polarized light emitting from the polarizer 101 can irradiate the carbon nanotube structure of the detecting element 102. An oriented direction of the carbon nanotubes of the carbon nanotube structure can be the same as a direction from the first electrode 103 to the second electrode 104. The measuring device 105 is used to measure a temperature difference or potential difference of the carbon nanotube structure. A light transmittance can be obtained by calculating the difference of temperature or potential, and the optical wavelength can be obtained by reading the light transmittance.

The polarizer 101 is used for transforming light into polarized light. The polarizer 101 can be any kinds of materials that can transform light into polarized light. For example the polarizer 101 can be yttrium aluminate, iodine, calcite or any other suitable material. The polarizer 101 can be a rotatable structure to form any angle between a polarized light direction and the oriented direction of the carbon nanotubes. The polarizer 101 can be rotated in a plane of the polarizer 101 to alter the angle between the direction of the polarized light and the oriented direction of the carbon nanotubes. Thus the angles between the polarized light direction and the oriented direction of the carbon nanotubes can be at any value within 0-90 degree. The polarizer 101 can be rotated by a rotating bracket. The polarized light can further irradiate a part of the carbon nanotube structure surface to generate a temperature or potential difference in the carbon nanotube structure. To generate such difference, a first point and a second point on the surface are selected. A first part is the part on the surface which is irradiated. A second point is the part on the surface that is not irradiated. The temperature or potential difference between the first point and the second point increase as the distance between the first point and the second point increases. In one embodiment, the plurality of photosensitive units 100 can share a common polarizer 101.

The detecting element 102 comprises the carbon nanotube structure. The carbon nanotube structure comprises a plurality of carbon nanotubes oriented along the same direction. The oriented direction of carbon nanotubes is parallel with a carbon nanotube structure surface. In one embodiment, the detecting element 102 is a carbon nanotube layer, and the carbon nanotube layer consists of a plurality of carbon nanotubes, joined to each other end to end by van der Waals attractive force. The carbon nanotubes in the carbon nanotube structure can be single-walled, double-walled, or multi-walled carbon nanotubes. A diameter of each single-walled carbon nanotube ranges from about 0.5 nanometers (nm) to about 10 nm. A diameter of each double-walled carbon nanotube ranges from about 1 nm to about 15 nm. A diameter of each multi-walled carbon nanotube ranges from about 1.5 nm to about 50 nm. The carbon nanotubes can be N-type carbon nanotubes or P-type carbon nanotubes.

The carbon nanotube structure can be a free-standing structure. The free-standing structure is that the carbon nanotube structure can keep a certain shape without any supporter, which is different from powder or liquid. The carbon nanotube structure comprises a plurality of carbon nanotubes joined to each other by van der Waals attractive force, thereby forming a certain shape. When the carbon nanotube structure is a free-standing structure, the detecting element 102 can be suspended. The carbon nanotube structure comprises at least one carbon nanotube film, at least one carbon nanotube wire structure, or a combination thereof. The carbon nanotube structure is a layer structure of a plurality of parallel arrangement carbon nanotubes.

Carbon Nanotube Wire Structure

In other embodiments, the carbon nanotube structure comprises one or more carbon nanotube wire structures. The carbon nanotube wire structure comprises carbon nanotube cables that comprise of twisted carbon nanotube wires, untwisted carbon nanotube wires, or combinations thereof. The carbon nanotube cable comprises two or more carbon nanotube wires, twisted or untwisted that are twisted or bundled together. The carbon nanotube wires in the carbon nanotube wire structure can be substantially parallel to each other to form a bundle-like structure or twisted with each other to form a twisted structure. When the carbon nanotube structure comprises a plurality of carbon nanotube wire structures, the carbon nanotube wire structures can be coplanar and substantially parallel to each other, or stacked and substantially parallel to each other. When the carbon nanotube structure comprises one carbon nanotube wire structure, the carbon nanotube wire structure bends orderly in a surface, thereby forming a planar structure, and the carbon nanotube wires of the carbon nanotube wire structure are substantially parallel to and connect to each other and arranged.

Figure 3:
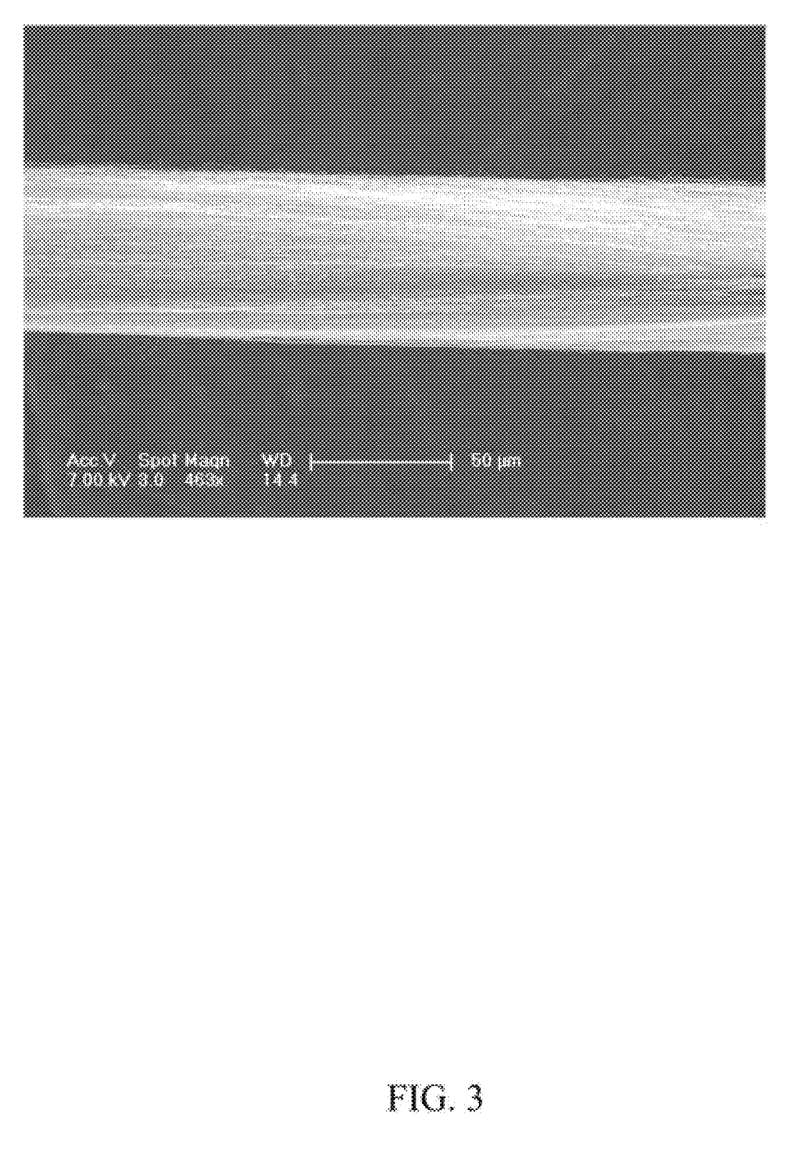
FIG. 3 is a SEM image of a non-twisted carbon nanotube wire used in the photosensitive unit.

FIG. 3, non-twisted carbon nanotube wire can be formed by treating the drawn carbon nanotube film with an organic solvent. The drawn carbon nanotube film is treated by applying the organic solvent to the drawn carbon nanotube film to soak the entire surface of the drawn carbon nanotube film. After being soaked by the organic solvent, the adjacent parallel carbon nanotubes in the drawn carbon nanotube film will bundle together, due to the surface tension of the volatile organic solvent as the organic solvent volatilizes, and thus, the drawn carbon nanotube film will be shrunk into a non-twisted carbon nanotube wire. The non-twisted carbon nanotube wire comprises a plurality of carbon nanotubes substantially oriented along the same direction (e.g., a direction along the length of the non-twisted carbon nanotube wire). The carbon nanotubes are substantially parallel to the axis of the non-twisted carbon nanotube wire. The non-twisted carbon nanotube wire comprises a plurality of carbon nanotube segments joined end-to-end by van der Waals attractive force. Each carbon nanotube segment comprises a plurality of carbon nanotubes being substantially parallel to each other and combined by van der Waals attractive force. A length of the non-twisted carbon nanotube wire can be arbitrarily set as desired. A diameter of the non-twisted carbon nanotube wire can range from about 0.5 nm to about 100 μm. In one embodiment, the diameter of the non-twisted carbon nanotube wire is about 50 μm. Examples of the non-twisted carbon nanotube wire are taught by US Patent Application Publication US 2007/0166223 to Jiang et al.

Figure 4:
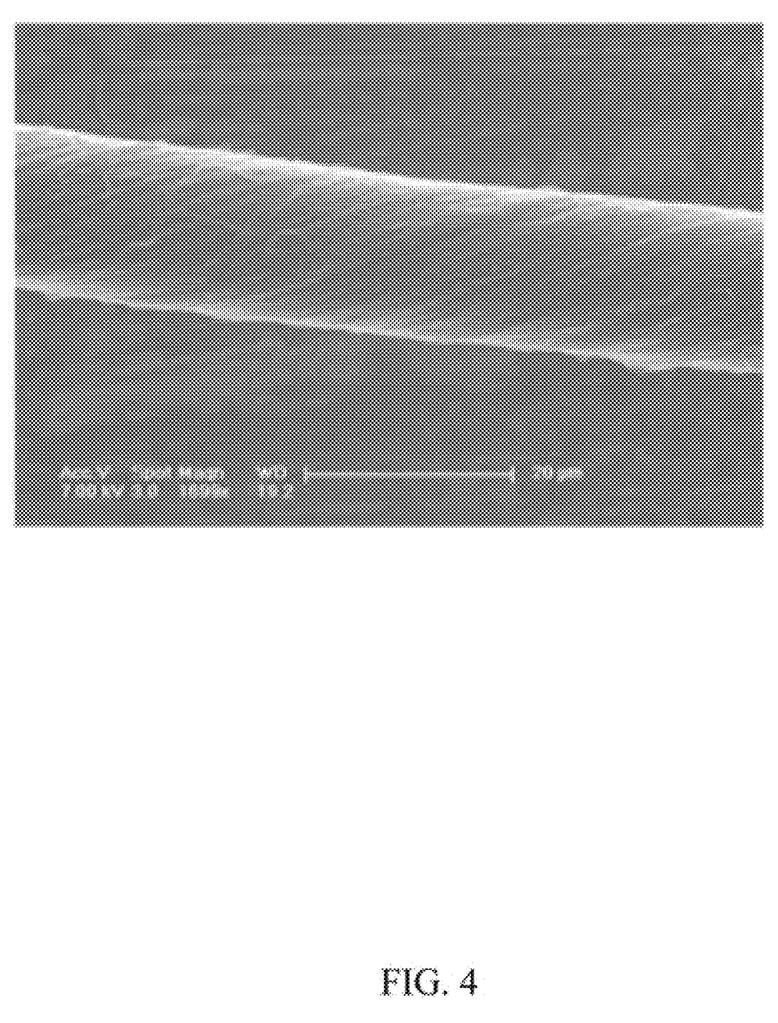
FIG. 4 is a SEM image of a twisted carbon nanotube wire used in the photosensitive unit.

The twisted carbon nanotube wire can be formed by twisting a drawn carbon nanotube film by using a mechanical force to turn the two ends of the drawn carbon nanotube film in opposite directions. As shown in FIG. 4, the twisted carbon nanotube wire comprises a plurality of carbon nanotubes oriented along an axial direction of the twisted carbon nanotube wire. The carbon nanotubes are aligned in a helix around the axis of the carbon nanotube twisted wire. More specifically, the twisted carbon nanotube wire comprises a plurality of successive carbon nanotube segments joined end-to-end by van der Waals attractive force. Each carbon nanotube segment comprises a plurality of carbon nanotubes substantially parallel to each other and combined by van der Waals attractive force. The carbon nanotube segment has arbitrary length, thickness, uniformity, and shape. A length of the carbon nanotube wire can be arbitrarily set as desired.

A diameter of the twisted carbon nanotube wire can range from about 0.5 nm to about 100 μm. Further, the twisted carbon nanotube wire can be treated with a volatile organic solvent, before or after being twisted. After being soaked by the organic solvent, the adjacent parallel carbon nanotubes in the twisted carbon nanotube wire will bundle together, due to the surface tension of the organic solvent as the organic solvent volatilizes. The specific surface area of the twisted carbon nanotube wire will decrease, but the density and strength of the twisted carbon nanotube wire will increase. It is understood that the twisted and non-twisted carbon nanotube cables can be produced by methods that are similar to the methods of making twisted and non-twisted carbon nanotube wires.

In one embodiment, the carbon nanotube structure is composed of at least one carbon nanotube wire structure. The carbon nanotubes in the carbon nanotube structure are substantially parallel to the carbon nanotube wire structure.

The thickness of the carbon nanotube structure can be selected as desired. The carbon nanotube structure is thick enough to guarantee that the detecting element 102 can detect the wavelength and the measured error is small. In one embodiment, the thickness of the carbon nanotube structure can range from about 0.5 nm to about 5 μm. The thickness of the carbon nanotube structure cannot be greater than 5 μm. If the thickness of the carbon nanotube structure is greater than 5 μm, because the incident light cannot pass through the carbon nanotube structure, a part of the carbon nanotubes cannot be irradiated by the light. The optical wavelength detecting device 100 has a large measurement error.

Figure 5:
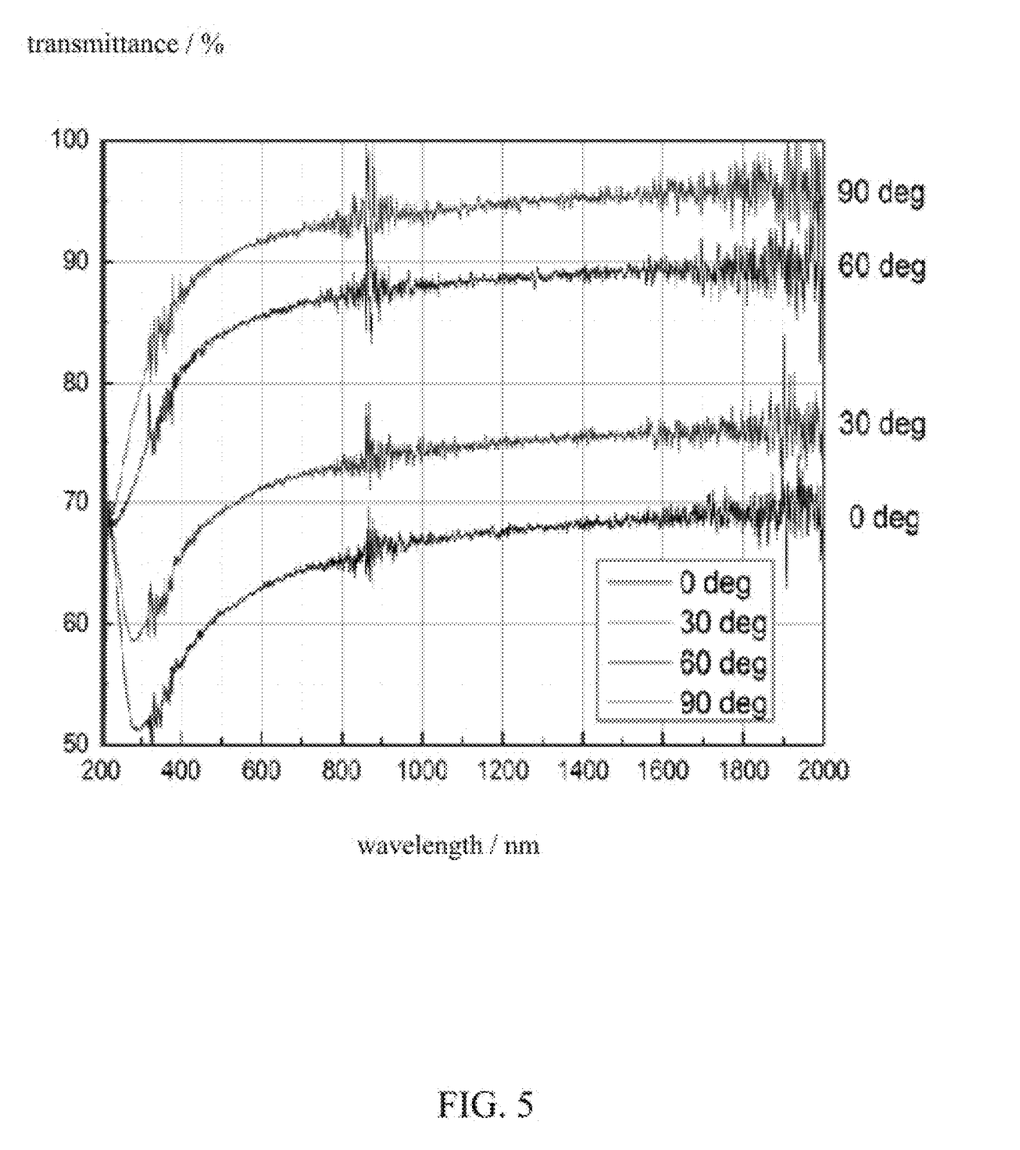
FIG. 5 is a diagram showing a relationship between a light transmittance of a carbon nanotube structure in the photosensitive unit and an optical wavelength.

FIG. 5 shows that in the carbon nanotube structure, the carbon nanotubes are being substantially parallel and extend along the same direction, the polarized light is selectively absorbed by the carbon nanotube structure according to the polarized light direction and polarized light wavelength. As an angle between the polarized light direction and the carbon nanotubes is unchanged, the polarized light transmittance increases monotonously as the wavelength increases. When the polarized light wavelength is kept unchanged, the angle changes can make the polarized light transmittance being changed. When the polarizing direction is substantially parallel to the carbon nanotubes orientation, the polarized light is easily absorbed by the carbon nanotube structure, so the polarized light transmittance is very low. When the polarizing direction is substantially perpendicular to the carbon nanotubes orientation, the polarized light can pass through the carbon nanotube structure easily, resulting in the polarized light transmittance being very high. Because the polarized light absorbed by the carbon nanotube structure can be converted into heat energy, the heat energy can produce temperature difference in the carbon nanotube structure and the temperature difference can change into the potential difference. The carbon nanotube structure can measure the polarized light wavelength as the temperature and voltage changes.

The carbon nanotube structure further comprises a P-N junction composed of a P-type semiconductor carbon nanotube layer 2021 and an N-type semiconductor carbon nanotube layer 2022. The P-type semiconductor carbon nanotube layer 2021 and the N-type semiconductor carbon nanotube layer 2022 can be stacked with each other or arranged side by side in the same plane. When the P-type semiconductor carbon nanotube layer 2021 and the N-type semiconductor carbon nanotube layer 2022 are arranged side by side in the same plane, the oriented direction of carbon nanotubes in the P-type semiconductor carbon nanotube layer 2021 is the same as the oriented direction of carbon nanotubes in the N-type semiconductor carbon nanotube layer 2022. And a contact surface of the P-type semiconductor carbon nanotube layer 2021 and the N-type semiconductor carbon nanotube layer 2022 is perpendicular to the oriented direction of carbon nanotubes. When the P-type semiconductor carbon nanotube layer 2021 and the N-type semiconductor carbon nanotube layer 2022 are stacked with each other, the contact surface of the P-type semiconductor carbon nanotube layer 2021 and the N-type semiconductor carbon nanotube layer 2022 is parallel to the oriented direction of carbon nanotubes.

When the carbon nanotube structure containing P-N junction is irradiated by the incident light, the incident light energy is directly converted into electrical energy and is not converted into heat energy. The temperature difference between a portion of the carbon nanotube structure irradiated with the incident light and a non-irradiated portion is small and negligible. In one embodiment, the effect of incident light on carbon nanotubes is changed from thermoelectric effect to photoelectric effect, which reduced the loss of intermediate energy. The structure with P-N junction enhances the sensitivity of the carbon nanotube structure to the incident light, thus the measurement of the device is more accurate.

In one embodiment, the detecting element 102 can be rotated freely in the detecting element plane to form different angles between the polarized light direction and the carbon nanotubes orientation. The polarizer 101 can also be rotated freely in the polarizer 101 plane to adjust the angles between the polarized light direction and the carbon nanotubes orientation.

The first electrode 103 and the second electrode 104 are made of conductive material. The first electrode 103 or the second electrode 104 shape is not limited and can be, for example, lamellar, rod, wire, block, or other shapes. A first and second electrodes 103, 104 material can be one metal or more metals, conductive adhesive, carbon nanotube, indium tin oxide, or other material. In one embodiment, the first electrode 103 and the second electrode 104 are rod-shaped metal electrodes. The carbon nanotubes in the carbon nanotube structure extend along a direction from the first electrode 103 to the second electrode 104. Some carbon nanotube structures have large specific surface area and better adhesion ability under the effect of the van der Waals attractive force and can be adhered directly to the first electrode 103 and the second electrode 104. This will result in good electrical contact between the carbon nanotube structure and the first and second electrodes 103, 104. Furthermore, a conductive adhesive layer (not shown) can be further provided between the first electrode 103 and/or the second electrode 104 and the carbon nanotube structure. The conductive adhesive layer can be applied to the carbon nanotube structure surface to provide electrical contact and better adhesion between the first and second electrodes 103, 104 and the carbon nanotube structure.

The measuring device 105 can be a voltage measuring device to measure the carbon nanotube structure voltage differences or a thermocouple device to measure the temperature differences of the carbon nanotube structure. The measuring device 105 can be electrically connected to the carbon nanotube structure by the first electrode 103 and the second electrode 104, thus a circuit is formed. When the carbon nanotube structure generates a potential between the first electrode 103 and the second electrode 104 because of the temperature difference, the carbon nanotube structure is equivalent to a power that is used to supply energy, and a current is generated in the circuit. The measuring device 105 can measure the carbon nanotube structure potential directly without any other power supply device. When the measuring device 105 is the thermocouple device, the thermocouple device can measure the temperature difference between the opposite two ends of the carbon nanotube structure. A measuring position can be selected as desired. When the polarized light irradiates a first part surface of the carbon nanotube structure, a second point in a second part surface which is not irradiated is selected, and the measuring device 105 measures the temperature difference or the potential difference between the first point and the second point. The carbon nanotube structure can further comprise a P-type semiconductor carbon nanotube layer and an N-type semiconductor carbon nanotube layer in contact with each other to form a P-N junction. A third point in the P-type semiconductor carbon nanotube layer is selected, a fourth point in the N-type semiconductor carbon nanotube layer is selected. The measuring device 105 can only measure the potential difference between the third point and the fourth point when the polarized light irradiates the P-N junction.

The data processor 108 is used to obtain the optical wavelength by calculating and analyzing the temperature difference or the potential difference. The data processor 108 comprise a database of transmittance-angle-wavelength values and can calculate the temperature difference or the potential difference to obtain the polarized light transmittance. Then the optical wavelength can be obtained according to the values of transmittance in the database of transmittance-angle-wavelength values.

The principle of measuring the optical wavelength by using the photosensitive device 10 can be further described in detail. Firstly, a beam of incident light is provided, and the incident light power is determined. The power is set to P, and the optical wavelength is set to $\lambda$. Secondly, the polarized light is formed by using the polarizer 101 to polarize the incident light. A certain amount of energy is lost when the incident light pass through the polarizer 101. A transmittance of the polarizer is set to $\alpha$. FIG. 5 shows that as the angle between the polarized light direction and the carbon nanotubes changes, the polarized light transmittances are different. The transmittance is set to T. When the polarizing direction is substantially parallel to the carbon nanotubes orientation, the transmittance is set to $T_{\lambda II}$. When the polarizing direction is substantially perpendicular to the carbon nanotubes orientation, the transmittance is set to $T_{\lambda\perp}$. When the polarized light irradiates the carbon nanotube structure, an electric potential is produced by the temperature difference induced in the carbon nanotube structure. An energy conversion efficiency is set to $\beta$. The energy conversion efficiency $\beta$ is only related to devices comprising carbon nanotubes and is not related to the carbon nanotubes orientation.

So a potential difference U of both carbon nanotube structure ends is defined by a formula (1), $$U=\sqrt{PR\alpha\beta(1-T)} \quad (1)$$

R is a carbon nanotube structure resistance. The carbon nanotube structure resistance is approximately unchanged despite the temperature variation range is not large. At the same time, a carbon nanotube structure has been determined, the resistance is kept unchanged and isn't related to the polarization direction of light and wavelength.

The polarizing direction is substantially parallel to the carbon nanotubes orientation, the potential difference of the carbon nanotube structure is $U_{II}$, $U_{II}=\sqrt{PR\alpha\beta(1-T_{\lambda II})}$.

The polarizing direction is substantially perpendicular to the carbon nanotubes orientation, the potential difference of the carbon nanotube structure is $U_\perp$, $$U_\perp=\sqrt{PR\alpha\beta(1-T_{\lambda\perp})}$$

K is defined, $$K = \frac{U_\chi}{U_\perp},$$

$$K = \frac{U_\chi}{U_\perp}$$

$$= \sqrt{\frac{1-T_{\lambda\chi}}{1-T_{\lambda\perp}}}$$

$$= \sqrt{\frac{1-T_{\lambda\perp}+T_{\lambda\perp}-T_{\lambda\chi}}{1-T_{\lambda\perp}}}$$

$$= \sqrt{1+\frac{T_{\lambda\perp}-T_{\lambda\chi}}{1-T_{\lambda\perp}}}$$

When the angle between the carbon nanotubes orientation and polarizing direction is unchanged, a transmittance difference between arbitrary wavelength is approximately kept unchanged.

$$T_{\lambda\perp} - T_{\lambda II} = C, \text{ the } C \text{ is unchanged}$$

$$K = \sqrt{1+\frac{T_{\lambda\perp}-T_{\lambda\chi}}{1-T_{\lambda\perp}}} = \sqrt{1+\frac{C}{1-T_{\lambda\perp}}} \quad (2)$$

Referring to the formula (2), the values of K and $T_{\lambda\perp}$ are monotonic. When the angle between the carbon nanotubes orientation and polarizing direction is unchanged, the value of $T_{\lambda\perp}$ increases as the wavelength increases. So the values of K and wavelength of incident light are monotonic.

A formula (3) can be obtained by changing the formula (2), $$T_{\lambda\perp} = 1 - \frac{C}{K^2-1} \quad (3)$$

Referring to the formula (3), $T_{\lambda\perp}$ can be obtained by calculating the value of K. The value of K can be obtained by calculating the values of $U_{II}$ and $U_\perp$ of the carbon nanotube structure under different conditions. When the angle between the carbon nanotubes orientation and polarizing direction is unchanged, the polarized light transmittance corresponds to a unique wavelength value. The optical wavelength can be obtained according to the values of transmittance in the database of transmittance-angle-wavelength values of the data processor 108. According to the Seebeck effect, $U=\rho\Delta T$, $\rho$ is the Seebeck coefficient and related to materials. The temperature differences change as the voltage value changes, and the wavelength value of incident light can also be calculated by the temperature differences. And the wavelength value of incident light are directly corresponded to the color of the light. An image can be obtained by an image processor according to a plurality of wavelength values.

The photosensitive device 10 further includes a substrate 106, and the substrate 106 is used for supporting the plurality of photosensitive units 100. In one embodiment, the plurality of photosensitive units 100 are located on a surface of a common substrate 106. The material of the substrate 106 can be rigid materials (e.g., p-type or n-type silicon, silicon with a silicon dioxide layer formed thereon, crystal, crystal with an oxide layer formed thereon), or flexible materials (e.g., plastic or resin). The material of the substrate 106 can be polyethylene terephthalate, polyethylene naphthalate two formic acid glycol ester (PEN), or polyimide. When the carbon nanotube structure does not have the P-N junction, the substrate 106 should be thermal insulating and electrically insulating material. When the carbon nanotube structure have the P-N junction, the substrate 106 should be electrically insulating material. In one embodiment, the material of the substrate 106 is polyethylene terephthalate.

Figure 6:
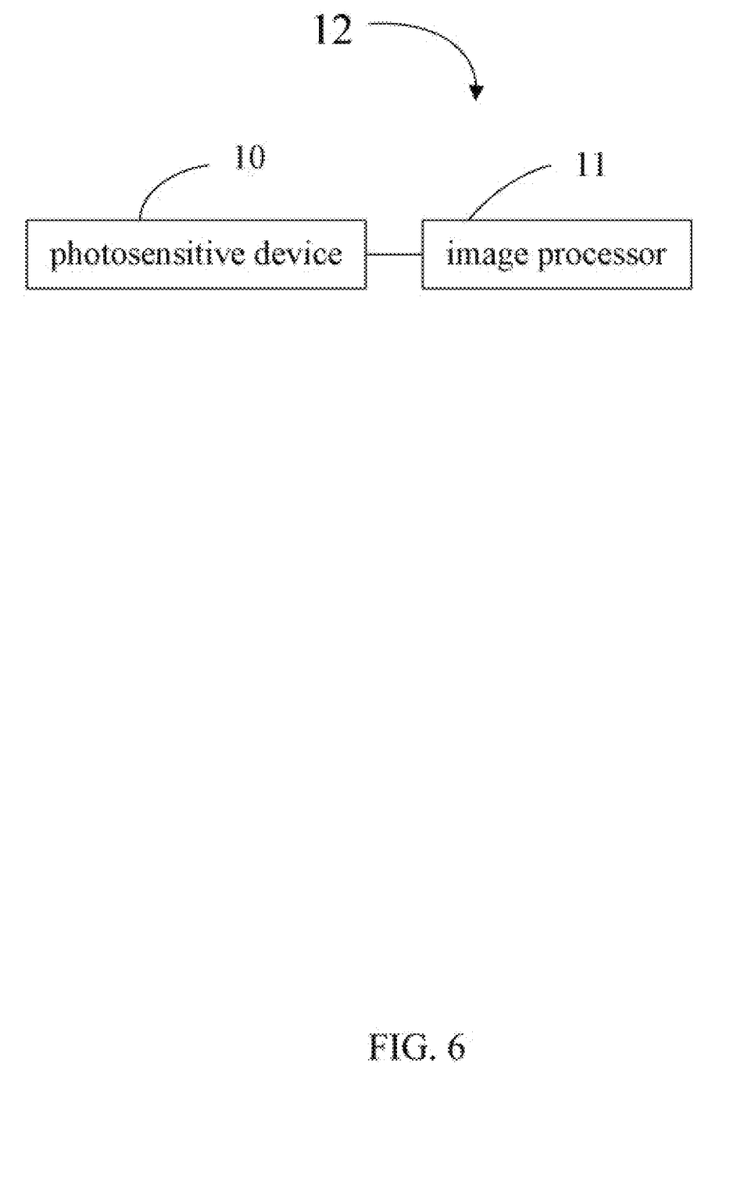
FIG. 6 is a schematic view of one embodiment of a camera.

FIG. 6 shows one embodiment of a camera 12 comprising an photosensitive device 10 and an image processor 11. The photosensitive device 10 is configured to detect the optical wavelengths. The image processor 11 is used to generate images by processing the optical wavelengths. The image processor 11 is connected to the data processor 108. The camera 12 is configured to generate the images according to the optical wavelengths.

The photosensitive device 10 has following advantages. The photosensitive device 10 can detect the wavelength of the light based on the thermoelectric effects and polarized light. And the wavelength of the light is corresponded to the color of the light. The principle is reliable. Each photosensitive unit can work independently to obtain a high image resolution. The structure of the photosensitive device 10 is simple, lightweight, and cheap.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Depending on the embodiment, certain of the steps of methods described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A camera comprising: a photosensitive device and an image processor, wherein the photosensitive device comprises:
a plurality of photosensitive units arranged to form an array, where each photosensitive unit is configured to receive and convert light signal to form a temperature difference or a potential difference;
a measuring device configured to measure the temperature difference or the potential difference; and
a data processor configured to analyze and calculate the potential difference or the temperature difference; each photosensitive unit comprises:
a polarizer configured to transform an incident light into a polarized light;
a detecting element configured to form the temperature difference or the potential difference between two points of the detecting element when the detecting element is exposed to the polarized light, wherein the detecting element comprises a carbon nanotube structure comprising a plurality of carbon nanotubes oriented along a same direction, and angles between a polarizing direction of the polarized light and an oriented direction of the plurality of carbon nanotubes is adjustable.

2. The camera as claimed in claim 1, wherein the polarizer and the carbon nanotube structure are relatively rotatable in two parallel planes.

3. The camera as claimed in claim 1, wherein the detecting element is a carbon nanotube wire, and the carbon nanotube wire comprises the plurality of carbon nanotubes connected to each other end to end by van der Waals attractive force.

4. The camera as claimed in claim 3, wherein the detecting element comprises a P-type semiconductor carbon nanotube wire and an N-type semiconductor carbon nanotube wire, and a P-N junction is formed between the P-type semiconductor carbon nanotube wire and the N-type semiconductor carbon nanotube wire.

5. The camera as claimed in claim 4, wherein the P-type semiconductor carbon nanotube wire and the N-type semiconductor carbon nanotube wire are joined end to end.

6. The camera as claimed in claim 4, wherein the measuring device is respectively electrically connected to the P-type semiconductor carbon nanotube wire and the N-type semiconductor carbon nanotube wire.

7. The camera as claimed in claim 1, wherein each photosensitive unit further comprises a first electrode and a second electrode spaced apart from each other, the first electrode and the second electrode are electrically connected to the carbon nanotube structure, and the measuring device is electrically connected to the first electrode and the second electrode.

8. The camera as claimed in claim 1, wherein the measuring device is a voltage measuring device or a thermocouple device.

9. The camera as claimed in claim 1, further comprising a substrate configured to support the plurality of photosensitive units.

10. The camera as claimed in claim 9, wherein the substrate comprises thermal insulating and electrically insulating material.

* * * * *